(12) United States Patent
Haskett et al.

(10) Patent No.: US 7,936,033 B2
(45) Date of Patent: May 3, 2011

(54) MICRO-OPTICAL DEVICE PACKAGING SYSTEM

(75) Inventors: Bradley Morgan Haskett, Allen, TX (US); John Patrick O'Connor, Irving, TX (US); Mark Myron Miller, McKinney, TX (US); Sean Timothy Crowley, Parker, TX (US); Jeffery Alan Miks, Chandler, AZ (US); Mark Phillip Popovich, Tokyo (JP)

(73) Assignees: Texas Instruments Incorporated, Dallas, TX (US); Amkor Technology, Inc., Chandler, AZ (US)

( * ) Notice: Subject to any disclaimer, the term of this patent is extended or adjusted under 35 U.S.C. 154(b) by 303 days.

(21) Appl. No.: 12/345,421

(22) Filed: Dec. 29, 2008

(65) Prior Publication Data

US 2010/0164081 A1     Jul. 1, 2010

(51) Int. Cl.
*H01L 31/0203*     (2006.01)
(52) U.S. Cl. ............... 257/433; 257/434; 257/E23.128; 257/E21.499; 438/116
(58) Field of Classification Search .................. 257/433, 257/434, E23.128, E23.129, E21.499; 438/116
See application file for complete search history.

(56) References Cited

U.S. PATENT DOCUMENTS

| | | | |
|---|---|---|---|
| 5,867,368 A | 2/1999 | Glenn |
| 5,949,655 A | 9/1999 | Glenn |
| 5,950,074 A | 9/1999 | Glenn et al. |
| 5,962,810 A | 10/1999 | Glenn |
| 6,034,429 A | 3/2000 | Glenn et al. |
| 6,117,193 A | 9/2000 | Glenn |
| 6,117,705 A | 9/2000 | Glenn et al. |
| 6,143,588 A | 11/2000 | Glenn |
| 6,266,197 B1 | 7/2001 | Glenn et al. |
| 6,268,654 B1 | 7/2001 | Glenn et al. |
| 6,274,927 B1 | 8/2001 | Glenn |
| 6,342,406 B1 | 1/2002 | Glenn et al. |
| 6,389,687 B1 | 5/2002 | Glenn et al. |
| 6,396,043 B1 | 5/2002 | Glenn et al. |
| 6,399,418 B1 | 6/2002 | Glenn et al. |
| 6,407,381 B1 | 6/2002 | Glenn et al. |
| 6,420,204 B2 | 7/2002 | Glenn |
| 6,455,774 B1 | 9/2002 | Webster |
| 6,483,030 B1 | 11/2002 | Glenn et al. |
| 6,483,101 B1 | 11/2002 | Webster |
| 6,492,699 B1 | 12/2002 | Glenn et al. |
| 6,503,780 B1 | 1/2003 | Glenn et al. |
| 6,509,560 B1 | 1/2003 | Glenn et al. |
| 6,512,219 B1 | 1/2003 | Webster et al. |
| 6,515,269 B1 | 2/2003 | Webster et al. |
| 6,526,653 B1 | 3/2003 | Glenn et al. |
| 6,528,857 B1 | 3/2003 | Glenn et al. |
| 6,548,759 B1 | 4/2003 | Glenn et al. |
| 6,571,466 B1 | 6/2003 | Glenn et al. |
| 6,586,824 B1 | 7/2003 | Glenn et al. |
| 6,603,183 B1 | 8/2003 | Hoffman |
| 6,620,646 B1 | 9/2003 | Glenn et al. |
| 6,627,864 B1 | 9/2003 | Glenn et al. |

(Continued)

*Primary Examiner* — Minh-Loan T Tran
(74) *Attorney, Agent, or Firm* — Charles A. Brill; Wade James Brady, III; Frederick J. Telecky, Jr.

(57) ABSTRACT

According to one embodiment, a micro-optical device includes an electro-optical circuit and an annular frame disposed on a surface of a substrate. The electro-optical circuit has an active region that is encapsulated by a window and an interconnect region adjacent at least one edge of the electro-optical circuit. The annular frame extends around an outer periphery of the window and is separated from the window by a gap, the annular frame and the electro-optical circuit form a cavity for placement of a plurality of bonding wires the interconnect that electro-optical circuit to the substrate.

17 Claims, 3 Drawing Sheets

U.S. PATENT DOCUMENTS

| | | |
|---|---|---|
| 6,629,633 B1 | 10/2003 | Glenn et al. |
| 6,630,661 B1 | 10/2003 | Hoffman |
| 6,670,551 B2 | 12/2003 | Lin et al. |
| 6,686,580 B1 | 2/2004 | Glenn et al. |
| 6,686,588 B1 | 2/2004 | Webster et al. |
| 6,710,945 B1 | 3/2004 | Miranda |
| 6,717,126 B1 | 4/2004 | Glenn et al. |
| 6,730,536 B1 | 5/2004 | Glenn et al. |
| 6,734,419 B1 | 5/2004 | Glenn et al. |
| 6,740,950 B2 | 5/2004 | Pack |
| 6,759,266 B1 | 7/2004 | Hoffman |
| 6,765,801 B1 | 7/2004 | Glenn et al. |
| 6,784,534 B1 | 8/2004 | Glenn et al. |
| 6,791,076 B2 | 9/2004 | Webster |
| 6,849,916 B1 | 2/2005 | Glenn et al. |
| 6,946,316 B2 | 9/2005 | Glenn et al. |
| 6,956,201 B2 | 10/2005 | Webster |
| 7,059,040 B1 | 6/2006 | Webster et al. |
| 7,091,571 B1 | 8/2006 | Park et al. |
| 7,126,111 B2 | 10/2006 | Webster |
| 7,145,253 B1 | 12/2006 | Kim et al. |
| 7,154,053 B2 | 12/2006 | Hsu |
| 7,199,359 B2 | 4/2007 | Webster |
| 7,227,236 B1 | 6/2007 | Lee et al. |
| 7,332,712 B2 | 2/2008 | Webster |
| 7,359,579 B1 | 4/2008 | Pack et al. |
| 7,396,741 B2 | 7/2008 | Mund et al. |

MICRO-OPTICAL DEVICE PACKAGING SYSTEM

TECHNICAL FIELD OF THE DISCLOSURE

This disclosure generally relates to optical devices, and more particularly, to a micro-optical device packaging system and a method of fabricating the same.

BACKGROUND OF THE DISCLOSURE

Light modulators, such as micro-optical-electromechanical systems (MOEMSs) or liquid crystal display (LCD) devices typically have a plurality of reflective elements for generating two-dimensional images. These devices modulate a light beam into pixels corresponding to the arrangement of reflective elements configured on the light modulator. Some light modulators, such as digital micro-mirror devices (DMDs), may be fabricated on semi-conductor materials using known planar processing techniques.

SUMMARY OF THE DISCLOSURE

According to one embodiment, a micro-optical device includes an electro-optical circuit and an annular frame disposed on a surface of a substrate. The electro-optical circuit has an active region that is encapsulated by a window and an interconnect region adjacent at least one edge of the electro-optical circuit. The annular frame extends around an outer periphery of the window and is separated from the window by a gap, the annular frame and the electro-optical circuit form a cavity for placement of a plurality of bonding wires the interconnect that electro-optical circuit to the substrate.

Some embodiments of the disclosure may provide numerous technical advantages. For example, some embodiments of the micro-optical device may be manufactured without requiring physical contact with electro-optical circuit or the window disposed outwardly from the active region. Thus, attachment of the annular frame may be provided during an assembly stage of manufacture that may be external to a clean room environment. An additional advantage that may be provided by certain embodiments is a gap that equalizes pressure between the cavity and the ambient environment due to periodic changes in barometric pressure.

Some embodiments may benefit from some, none, or all of these advantages. Other technical advantages may be readily ascertained by one of ordinary skill in the art.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

Various types of imaging devices, such as image sensors, light modulators, and image generators, may be manufactured using known integrated circuit (IC) processing techniques. These imaging devices are typically formed on a surface of a semiconductor material, such as silicon or gallium-arsenide having an active region for manipulation of light, such as from an external light source. These imaging devices are generally formed of a plurality of elements that may be arranged as a two-dimensional array over the active region of the imaging device.

Elements forming the active region are relatively small in size and thus may be sensitive to contamination by dust or other airborne debris. Fabrication of image devices is therefore, often performed in clean rooms to control the level of contaminants that may be potentially harmful to these elements. Prior to leaving the clean room, a transparent window may be placed over the active region for protection during normal use.

Integrated circuit manufacturing techniques typically involve manufacture of numerous imaging devices on a wafer followed by an assembly process in which each imaging device is separated from the wafer and mounted in a suitable package. Due to the relatively sensitive nature of its active region, the assembly process of many imaging devices must also be performed in the sanctity of the clean room.

Figure 1:
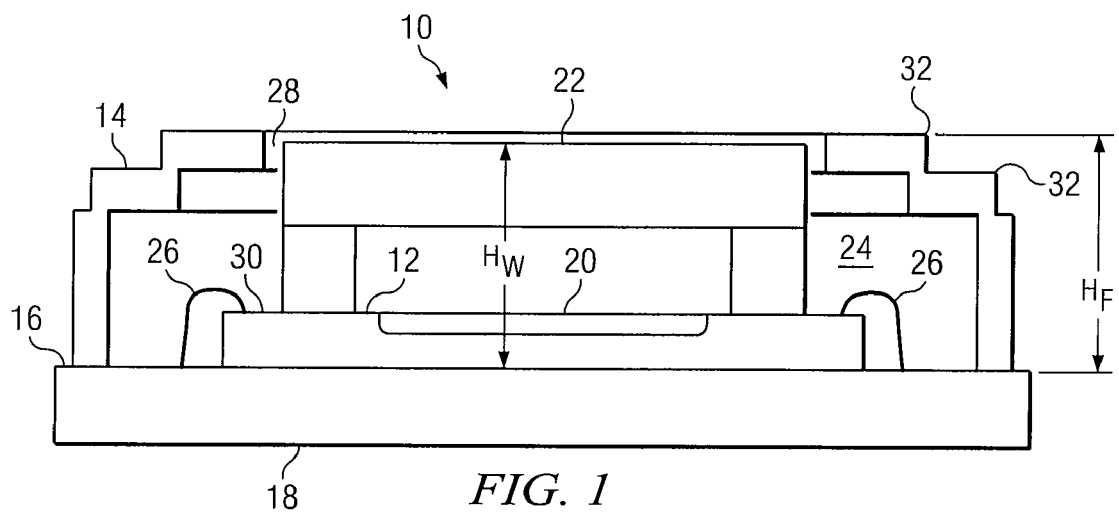
FIG. 1 is a side elevational view of one embodiment of an electro-optical device according to the teachings of the present disclosure.
Figure 2:
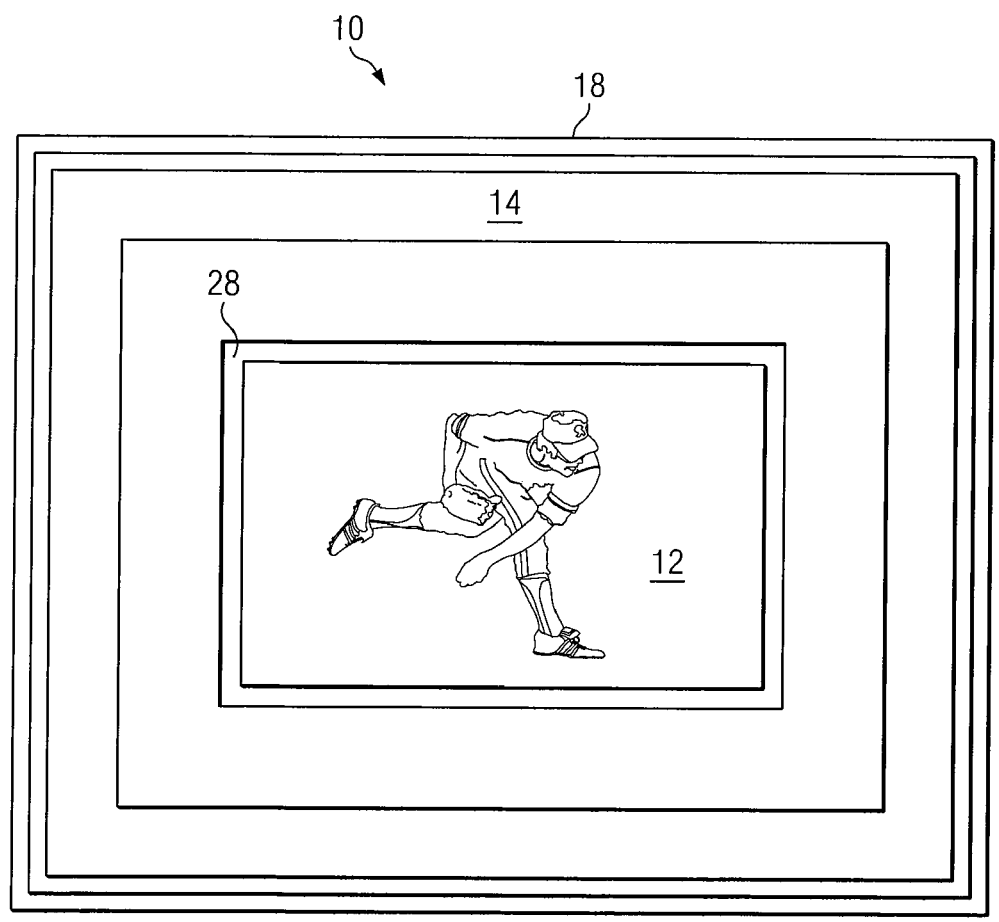
FIG. 2 is a top view of the electro-optical device of FIG. 1.

FIGS. 1 and 2 show a side view and a top view, respectively, of one embodiment of a micro-optical device 10 according to the teachings of the present disclosure. Micro-optical device 10 includes an electro-optical circuit 12 and an annular frame 14 attached to a surface 16 of a substrate 18. Electro-optical circuit 12 has an active region 20 configured to generate, receive, or modulate light through a window 22. A cavity 24 is formed between annular frame 14 and electro-optical circuit 12 for encasing a plurality of bonding wires 26. Annular frame 14 extends around the outer periphery of window 22 and is separated from window 22 by a gap 28.

Certain embodiments incorporating a gap 28 between window 22 and annular frame 14 may provide numerous benefits. For example, gap 28 may equalize pressure variations between cavity 24 and the ambient environment due to changes in barometric pressure. Gap 28 may also provide a fabrication procedure for micro-optical device 10 that may not require physical contact with electro-optical circuit 12, window 22, and/or bonding wires 26 during its assembly. Thus, attachment of annular frame 14 to substrate 18 may be provided during an assembly stage of production that may be external to a clean room environment.

Electro-optical circuit 12 may be any electrical device that manipulates or receives light, such as, for example, a micro-optical-electromechanical system (MOEMS) device, or a charge coupled display (CCD) device that generates an electrical signal representative of an image. In one embodiment, electro-optical circuit 12 is a light modulator, such as a digital micro-mirror device (DMD) that modulates light generated by an external source into a two-dimensional image. The digital micro-mirror device has a plurality of relatively small mirrors arranged in an M×N configuration on active region 20 and adapted to selectively reflect light emanating from the external source to or away from a planar surface. When coordinated together, the plurality of mirrors modulate light from the light source to create an image on the planar surface.

Electro-optical circuit 12 has an interconnect region 30 that provides electrical connection of the various elements of active region to substrate 18 using bonding wires 26. Interconnect region 30 covers a portion of the surface of electro-optical circuit 12 adjacent its edge. In the particular embodiment shown in which electro-optical circuit 12 is rectangular in shape, interconnect region 30 may be disposed adjacent any one or more if its edges. Bonding wires 26 are relatively thin and thus may be susceptible to damage if not sufficiently protected. Annular frame 14 provides protection for bonding wires 26 by inhibiting physical access to bonding wires 26 from objects external to micro-optical device 10.

Window 22 is generally transparent to light and configured outwardly from active region 20. Window 22 protects the various elements of active region 20 while allowing light to pass through freely. Window 22 is disposed outwardly from the surface 16 of substrate 18 at a height $H_W$ that may be specified according to its thickness and its desired distance from active region 20. In one embodiment, annular frame 14 has a height $H_F$ from the surface 16 that is approximately similar to the height $H_W$ of window 22 for protection of the edges of window from physical damage. In other embodiments, the height $H_F$ of annular frame 14 may be less or greater than the height $H_W$ of window 22. For example, a particular height $H_F$ of annular frame 14 that is less than height $H_W$ of window 22 may provide enhanced optical clearance of the light path through window 22 while a height $H_F$ greater than height $H_W$ may provide enhanced protection of window 22 in some embodiments.

Annular frame 14 may be formed of any suitable material, such as plastic, having a generally rigid shape for protection of bonding wires 26 from the external environment. Gap 28 formed between annular frame 14 and window 22 may have any width that provides sufficient protection for bonding wires 26 due to normal use and provides ample clearance for ease of assembly. In one embodiment, the width of gap 28 is approximately 180 microns. In some embodiments, gap 28 may have any width that is between 0 and 1000 microns.

Substrate 18 may be made of any suitable material, such as ceramic, that has a planar surface 16 for attachment of electro-optical circuit 12 and annular frame 14. Electro-optical circuit 12 and annular frame 14 may be bonded to surface 16 using any suitable adhesive material. In one embodiment, annular frame 14 may be free of any mechanical bond to window 22. In this manner, flexure or strain of the annular frame 14 due to external forces may not be transferred to window 22 and thus to electro-optical circuit 12. In another embodiment, annular frame 14 is bonded to window 22 with an adhesive such that cavity 24 is hermetically sealed from the outside environment.

A hole 38 may optionally be provided for filling cavity 24 with a potting material, such as an epoxy compound having a relatively low working viscosity. In other embodiments, the gap 28 may be sufficiently wide to provide insertion of potting material through gap 28. Annular frame 14, therefore, may serve as a dam for containment of potting material during its curing phase.

Figure 3:
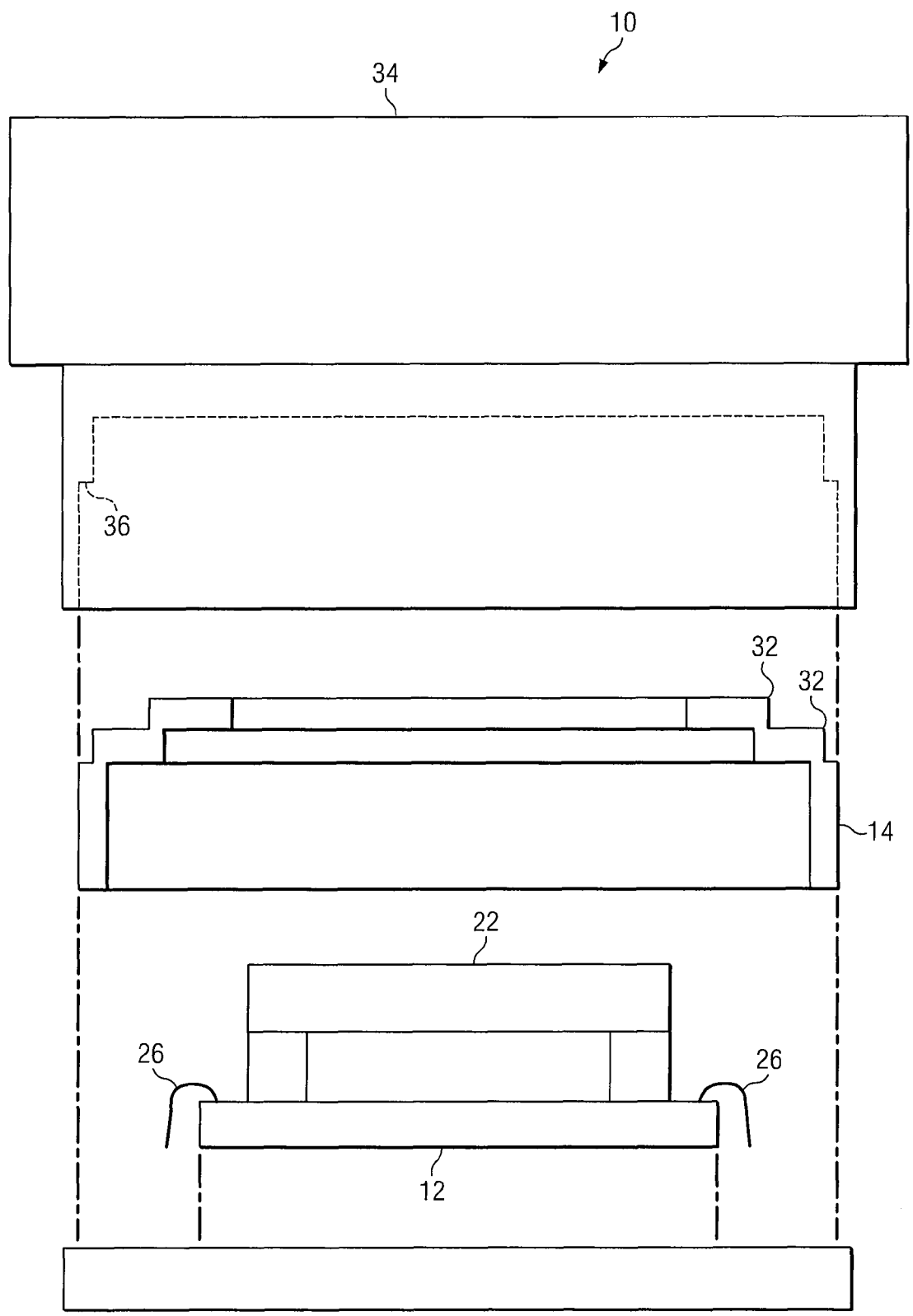
FIG. 3 is an exploded view of the electro-optical device of FIG. 1 showing a lens housing that may be secured to the annular frame.

FIG. 3 is an exploded view of the micro-optical device 10 of FIGS. 1 and 2. In the particular embodiment shown, annular frame 14 has several mechanical alignment features 32 for releasable securement of a lens housing 34 to its surface at a specified position and orientation relative to electro-optical circuit 12. Mechanical alignment features 32 include ridges formed in annular frame 14 such that its outer contour is complementary to an inner contour 36 of lens housing 34. In other embodiments, mechanical alignment features 32 may have any physical shape that maintains lens housing 34 in a specified position and orientation relative to electro-optical circuit 12.

Modifications, additions, or omissions may be made to micro-optical device 10 without departing from the scope of the disclosure. The components of micro-optical device 10 may be integrated or separated. For example, electro-optical circuit 12 may be implemented on multiple semiconductor substrates and attached over varying regions of substrate 18 such that each semiconductor substrate is interconnected to one another via bonding wires. Moreover, the operations of micro-optical device 10 may be performed by more, fewer, or other components. For example, electro-optical circuit 12 may include other electrical components, such as line conditioning circuits, timing circuits, and/or control circuits for manipulating the manner in which elements of active region 20 are used. As used in this document, "each" refers to each member of a set or each member of a subset of a set.

Figure 4:
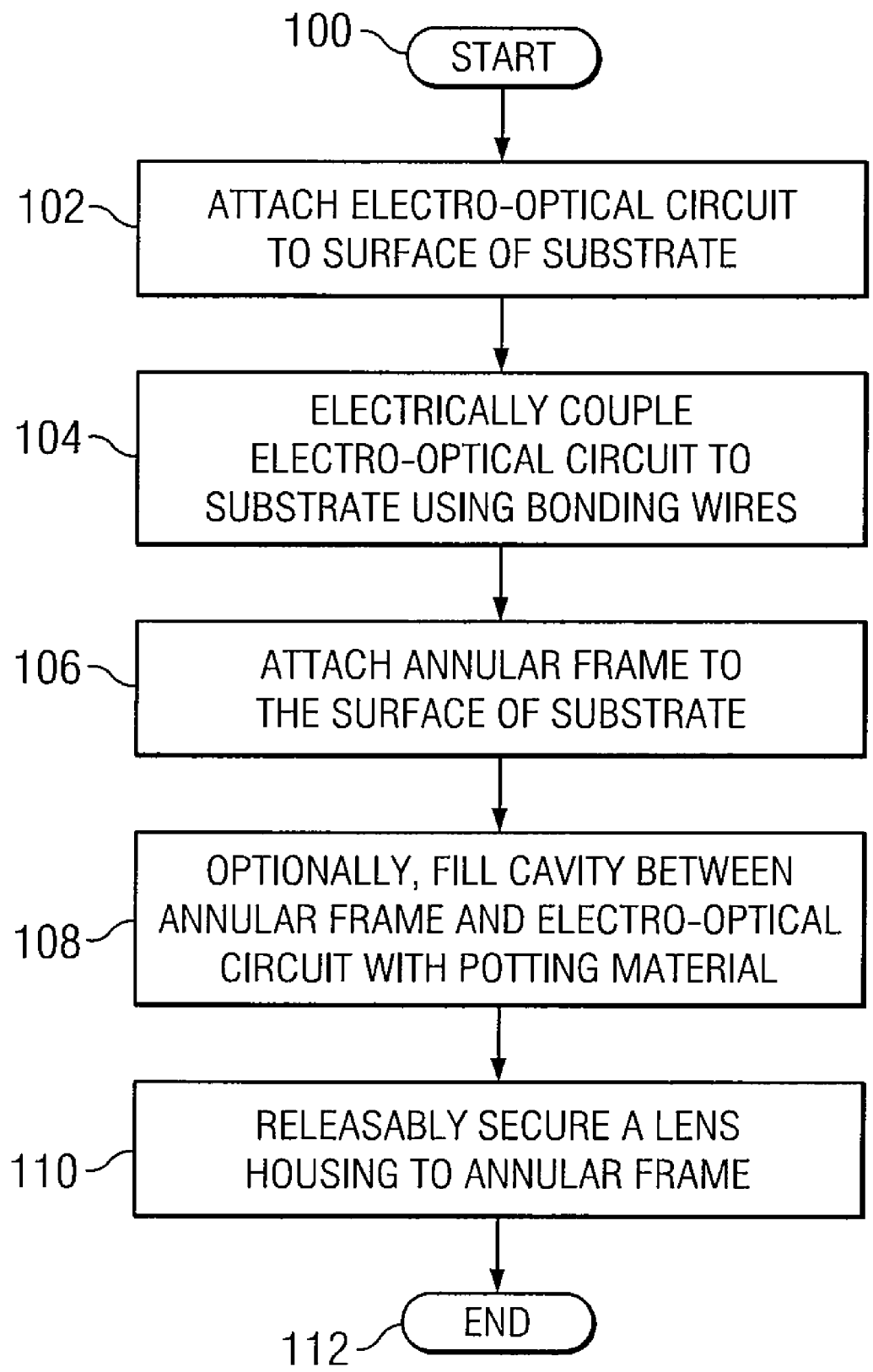
FIG. 4 is a flowchart showing a series of actions that may be performed to manufacture the electro-optical device of FIG. 1.

FIG. 4 is a flowchart showing one embodiment of a series of actions that may be performed to manufacture the micro-optical device 10 of FIG. 1. In act 100, the process is initiated.

In act 102, electro-optical circuit 12 is attached to the surface 16 of substrate 18. Electro-optical circuit 12 may be attached using any suitable approach, such as with a suitable adhesive or using a solder process in which various electrical connections are formed that rigidly constrain electro-optical circuit 12 to the surface 16 of substrate 18. In one embodiment, electro-optical circuit 12 is a digital micro-mirror device that modulates light from an external source into an image that may be displayed on a generally planar surface.

In act 104, electro-optical circuit 12 is electrically coupled to substrate 18 using bonding wires 26. In one embodiment, electrical coupling of electro-optical circuit 12 is performed external to a clean-room environment. A clean-room environment generally describes a type of environment in which particulate matter, such as dust or other airborne debris, is regulated to a relatively low level. Certain embodiments incorporating electro-optical circuit 12 having a window 22 for encapsulation of active region 20 may provide an assembly procedure for micro-optical device 10 that may not need to be conducted in a clean-room environment.

In act 106, annular frame 14 is attached to the surface 16 of substrate 18. In one embodiment, annular frame 14 is attached to surface 16 using a suitable adhesive. In another embodiment, annular frame 14 has tabs, detents, or other similar type of structural features for attaching annular frame 14 to surface 16 using a snap fit type action. In another embodiment, annular frame 14 may be configured with one or more metallic pads over a portion of its surface for attachment to surface 16 using solder. Annular frame 14 may be made of any generally rigid material, such as plastic, for protection of bonding wires 26. In one embodiment, a gap 28 is formed between annular frame 14 and window 22 for ease of assembly. In one embodiment, annular frame 14 is attached to substrate 18 external to a clean-room environment for reasons cited above.

In act 108, cavity 24 formed between annular frame 14 and electro-optical circuit 12 is optionally filled with a potting material. Annular frame 14 serves as a dam for containment of potting material while in its uncured state thus allowing the use of potting materials having relatively low working viscosity in some embodiments.

In act 110, a lens housing 34 is secured on annular frame 14. Annular frame 14 has one or more mechanical alignment features 32 that maintains lens housing 34 in a fixed position and orientation relative to electro-optical circuit 12. Using mechanical alignment features 32, lens housing 34 may be secured to micro-optical device 10 during fabrication processes for other devices that incorporate electro-optical device 10, such as camera phones, which may alleviate costs and complexity associated with camera assembly procedures for incorporation of these devices in some embodiments.

Modifications, additions, or omissions may be made to the method without departing from the scope of the disclosure. The method may include more, fewer, or other acts. For example, electrical coupling of bonding wires 26 and/or attachment of annular frame 14 to substrate may be conducted within or external to a clean room. The arrangement of annular frame 14 and window 22 provides a manufacturing process whereby assembly in a relatively high controlled environment, such as a clean room may not be necessary.

Although the present disclosure has been described with several embodiments, a myriad of changes, variations, alterations, transformations, and modifications may be suggested to one skilled in the art, and it is intended that the present disclosure encompass such changes, variations, alterations, transformation, and modifications as they fall within the scope of the appended claims.

What is claimed is:

1. A micro-optical device comprising:
    a digital micro-mirror device disposed on a surface of a substrate, the digital micro-mirror device having an active region that is encapsulated by a window and an interconnect region adjacent at least one edge of the digital micro-mirror device;
    a plurality of bonding wires that electrically couple the interconnect region to the surface of the substrate; and
    an annular frame attached to the surface and extending around an outer periphery of the window, the annular frame separated from the window by a gap that is less than 1000 microns in width, the annular frame and the digital micro-mirror device forming a cavity for placement of the plurality of bonding wires, the annular frame having a height approximately the same height as the window from the surface of the substrate and having an outer surface configured with one or more mechanical alignment features that are operable to couple an optical device to the electro-optical circuit at a predetermined position and orientation.

2. A method for manufacturing a micro-optical device comprising:
    providing an electro-optical circuit having an active region that is encapsulated by a window and an interconnect region adjacent at least one edge of the electro-optical circuit;
    attaching the electro-optical circuit to a surface of a substrate;
    electrically connecting the substrate to the interconnect region; and
    partially enclosing the electro-optical circuit and the substrate with a structure that extends around and outer periphery of the window but is not affixed to the window.

3. The method of claim 2, wherein partially enclosing the electro-optical circuit with the structure comprises partially enclosing the electro-optical circuit with the structure externally to a clean-room environment.

4. The method of claim 2, further comprising filling a cavity between the structure and the electro-optical circuit with a potting material.

5. The method of claim 2, further comprising securing a lens housing to the structure.

6. The method of claim 5, further comprising maintaining the lens housing at a fixed position and orientation relative to the electro-optical circuit using one or mechanical alignment features configured on the structure.

7. The method of claim 2, wherein partially enclosing the electro-optical circuit with the structure comprises forming a gap between the structure and the window, the gap being less than 1000 microns.

8. The method of claim 2, wherein attaching the electro-optical circuit to the surface comprises attaching the electro-optical circuit to the surface externally to a clean-room environment.

9. A micro-optical device comprising:
    an electro-optical circuit disposed on a surface of a substrate, the electro-optical circuit having an active region that is encapsulated by a window and an interconnect region adjacent at least one edge of the electro-optical circuit,
    a plurality of bonding wires that electrically couple the interconnect region to the substrate; and
    an annular frame attached to the surface and extending around an outer periphery of the window and separated from the window by a gap, the annular frame and the electro-optical circuit forming a cavity for placement of the plurality of bonding wires.

10. The micro-optical device of claim 9, wherein the annular frame is free of any mechanical bond to the window.

11. The micro-optical device of claim 9, wherein the gap is less than 1000 microns in width.

12. The micro-optical device of claim 9, wherein the window extends to a height from the surface of the substrate approximately the same height as the annular frame from the surface of the substrate.

13. The micro-optical device of claim 9, wherein the cavity is filled with a potting material.

14. The micro-optical device of claim 9, wherein the electro-optical circuit comprises a digital micro-mirror device (DMD).

15. The micro-optical device of claim 9, wherein the annular frame is made of plastic.

16. The micro-optical device of claim 9, wherein the annular frame comprises one or more alignment features that are operable to couple an optical device to the electro-optical circuit at a predetermined position and orientation.

17. The micro-optical device of claim 16, wherein the optical device comprises a lens.

* * * * *